US006896546B2

(12) United States Patent
Ichihara et al.

(10) Patent No.: US 6,896,546 B2
(45) Date of Patent: May 24, 2005

(54) METHOD FOR ASSEMBLING SEMICONDUCTOR DEVICE SOCKET

(75) Inventors: Kenji Ichihara, Kawasaki (JP); Azusa Shiratori, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/845,235

(22) Filed: May 14, 2004

(65) Prior Publication Data

US 2004/0229500 A1 Nov. 18, 2004

(30) Foreign Application Priority Data

May 15, 2003 (JP) ....................................... 2003-137924

(51) Int. Cl.[7] .................................................. H05K 1/00

(52) U.S. Cl. ...................................................... 439/526

(58) Field of Search ................................. 439/526, 289, 439/65–66, 70, 74, 76.1; 324/756, 72.5; 361/730, 803, 776

(56) References Cited

U.S. PATENT DOCUMENTS 3,409,861 A * 11/1968 Barnes et al. ............... 439/331
3,529,213 A * 9/1970 Farrand et al. ............. 361/730
4,026,412 A * 5/1977 Henson ....................... 206/728
4,027,935 A * 6/1977 Byrnes et al. .............. 439/289
4,622,514 A * 11/1986 Lewis ........................ 324/761
4,713,022 A * 12/1987 Pfaff .......................... 439/331
4,843,315 A 6/1989 Bayer et al.
5,295,841 A * 3/1994 Grabbe et al. ................ 439/73
5,397,245 A * 3/1995 Roebuck et al. ............ 439/264

FOREIGN PATENT DOCUMENTS

JP 63-255671 10/1988
JP 2000-113952 4/2000

* cited by examiner

*Primary Examiner*—J. F. Duverne
(74) *Attorney, Agent, or Firm*—Finnegan, Henderson, Farabow, Garrett & Dunner, LLP

(57) ABSTRACT

A tip end of a stationary terminal section of a contact pin is inserted via a hole of a contact pin supporting plate into a common gap formed by holes, and held there the holes of the first position-restricting plate and the holes of the second position-restricting plate may be slid away from each other in a common plane to grip the end of the stationary terminal section of the contact terminal by the peripheral edges of the holes; the stationary terminal section of the contact terminal may have an engaging portion to be engageable with an open end peripheral edge of the hole in the first position-restricting plate.

8 Claims, 16 Drawing Sheets

METHOD FOR ASSEMBLING SEMICONDUCTOR DEVICE SOCKET

This application claims priority from Japanese Patent Application No. 2003-137924 filed May 15, 2003, which is incorporated hereinto by reference.

BACKGROUND OF THE INVENTION

1. Field of the Invention

The present invention relates to a method for assembling a semiconductor device socket, including a process for arranging a plurality of contact terminals on a supporting plate.

2. Description of the Related Art

A semiconductor integrated circuit mounted to an electronic equipment or others is subjected to various tests prior to being mounted to remove a latent defect thereof. Of these various tests, a burn-in test carried out under a high temperature condition for a predetermined time is effective for removing the integrated circuit of infant mortality failures.

A test jig used for this burn-in test is generally called as an IC socket, and, as disclosed, for example, in Japanese Patent Application Laid-open No.2000-113952, constituted by a object under test accommodating member (a socket body) arranged on a printed wiring board (a printed board) and having an accommodating portion in which a BGA (ball grid array) type semiconductor element is mounted as a object under test, a plurality of contact terminals (contact pins) arranged beneath the accommodation section of the object under test accommodating member, for the electric connection of the semiconductor element with the printed circuit board, a cover member covering an upper portion of the object under test accommodating member, having a pressing section brought into contact with the upper surface of the semiconductor element to press terminals of the semiconductor element to contact points of the plurality of contact terminals at a predetermined pressure, and a hook member (a latch member) supported by the cover member in rotatable manner and engaged with the object under test accommodating member to fix the cover member with the object under test accommodating member.

The printed wiring board has an input/output section supplied with a predetermined test voltage and transmitting an abnormal signal indicating a short-circuit or others generated from the object under test. Each of the plurality of contact terminals includes a contact point brought into contact with an electrode of the semiconductor element, a stationary terminal section soldered to an electro-conductive layer of the printed circuit board, and a connecting section for connecting the contact point to the stationary terminal section.

A series of processes for assembling such an IC socket includes, as disclosed in Japanese Patent Application Laid-open No. 2000-113952, a process for press-fitting the stationary terminal section of the respective contact terminal into a relatively small circular hole formed in the bottom of the accommodating portion of the object under test accommodating member. The stationary terminal section is supported by being press-fitted into the relatively small hole formed in the bottom of the accommodating portion of the object under test accommodating member.

In the press-fitting process, it is required that the stationary terminal sections of the contact terminals are press-fit into the circular holes so that the orientation of the contact points of the contact terminals becomes uniform approximately in the same direction for the purpose of assuring the electric connection.

However, since the stationary terminal section is relatively thin, the stationary terminal sections of several contact terminals in the plurality of contact terminals may rotate about a center line of the circular hole or fall down due to a pressing force during the press-fitting process. In such a case, the rotational position of the stationary terminal section fitted into the hole is difficult to be adjusted, it is necessary to once pull out the already press-fit stationary terminal section from the hole and press-fit the same again. Therefore, the efficiency of the assembly operation becomes worse.

SUMMARY OF THE INVENTION

In view of the above-mentioned problems, an object of the present invention is to provide a method for assembling a semiconductor device socket including a process for arranging a plurality of contact terminals on a supporting plate, capable of facilitating the efficiency for the assembly operation without the necessity of the positional adjustment of the contact terminal.

To achieve the above object, the inventive method for assembling a semiconductor device socket comprises a step for overlaying a supporting plate for fixing stationary terminal portions of contact terminals for electrically connecting electrode sections of a semiconductor device to an electro-conductive layer of a wiring board on a first position-restricting plate and a second position-restricting plate with each other while coinciding attachment holes of the supporting plate with holes of the first position-restricting plate and the second position-restricting plate, a step for inserting a tip end of the stationary terminal section of the contact terminal into a common gap in the attachment holes of the supporting plate and the holes of the first position-restricting plate and the second position-restricting plate overlaid with each other and gripping the end of the stationary terminal section of the contact terminal by the peripheral edges of the holes, and a step for engaging a portion being engaged of the lo stationary terminal section with the attachment hole of the supporting plate while maintaining the supporting of the end of the stationary terminal section of the contact terminal.

The method may further comprise a step for separating the first position-restricting plate and the second position-restricting plate from the supporting plate.

The holes of the first position-restricting plate and the holes of the second position-restricting plate may be slid away from each other in a common plane to grip the end of the stationary terminal section of the contact terminal by the peripheral edges of the holes.

The stationary terminal section of the contact terminal may have an engaging portion to be engageable with an open end peripheral edge of the hole in the first position-restricting plate.

As apparent from the above description, according to the inventive method for assembling a semiconductor device socket, after the end of the stationary terminal section of the contact terminal is inserted into a common gap in the holes of the supporting plate and the first and second position-restricting plates overlaid with each other to support the same by the peripheral edge of the hole, the portion being engaged of the stationary terminal section is engaged with the attachment hole of the supporting plate while maintaining the supporting of the end of the stationary terminal section of the contact terminal. Thereby, the positional adjustment is unnecessary, and the efficiency of the assembly operation as well as the positional accuracy of the contact terminal are enhanced.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 3:
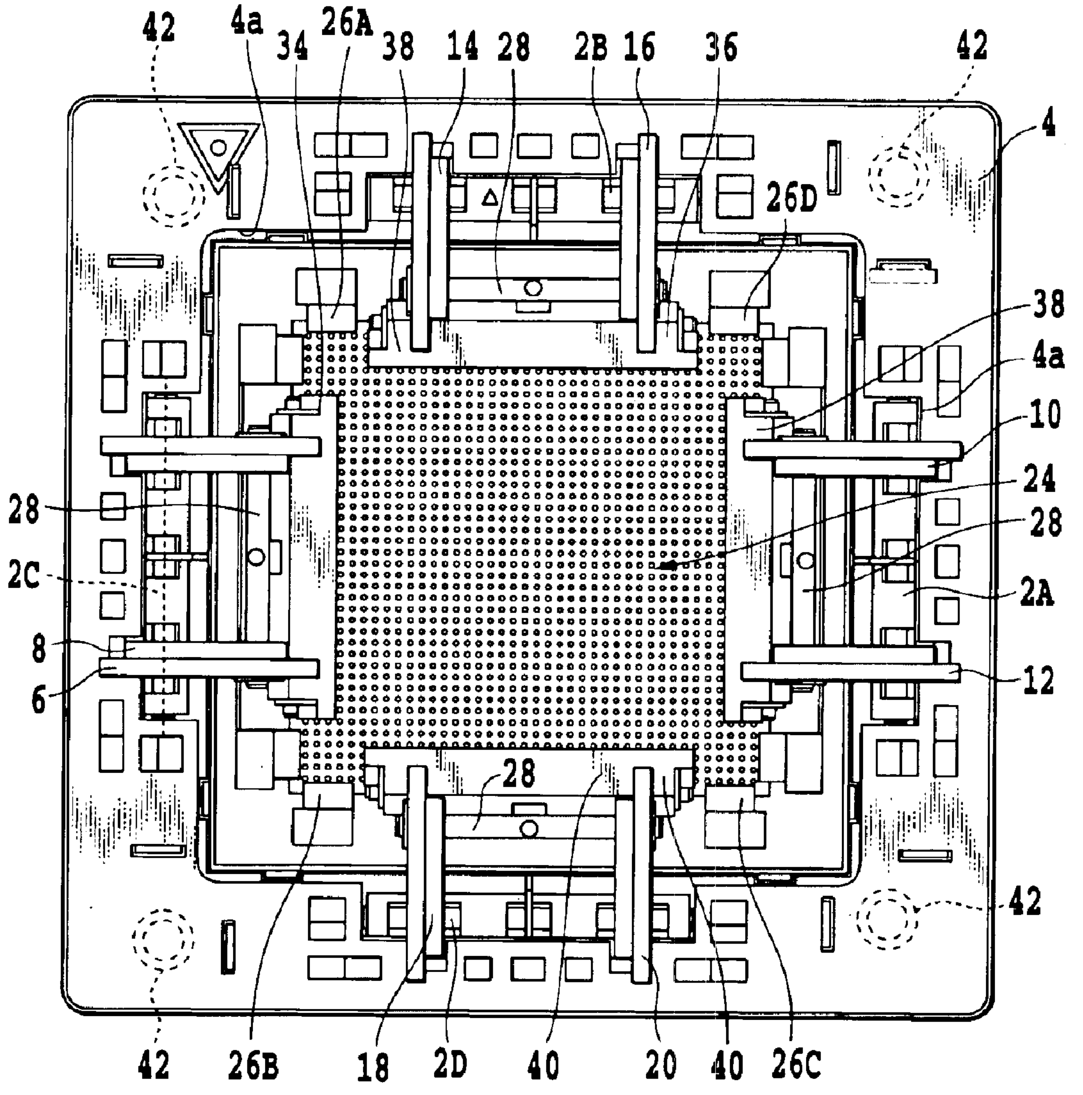
FIG. 3 is a plan view illustrating an appearance of the semiconductor device socket to which is applied lo the inventive method for assembling a socket for a semiconductor device.
Figure 4:
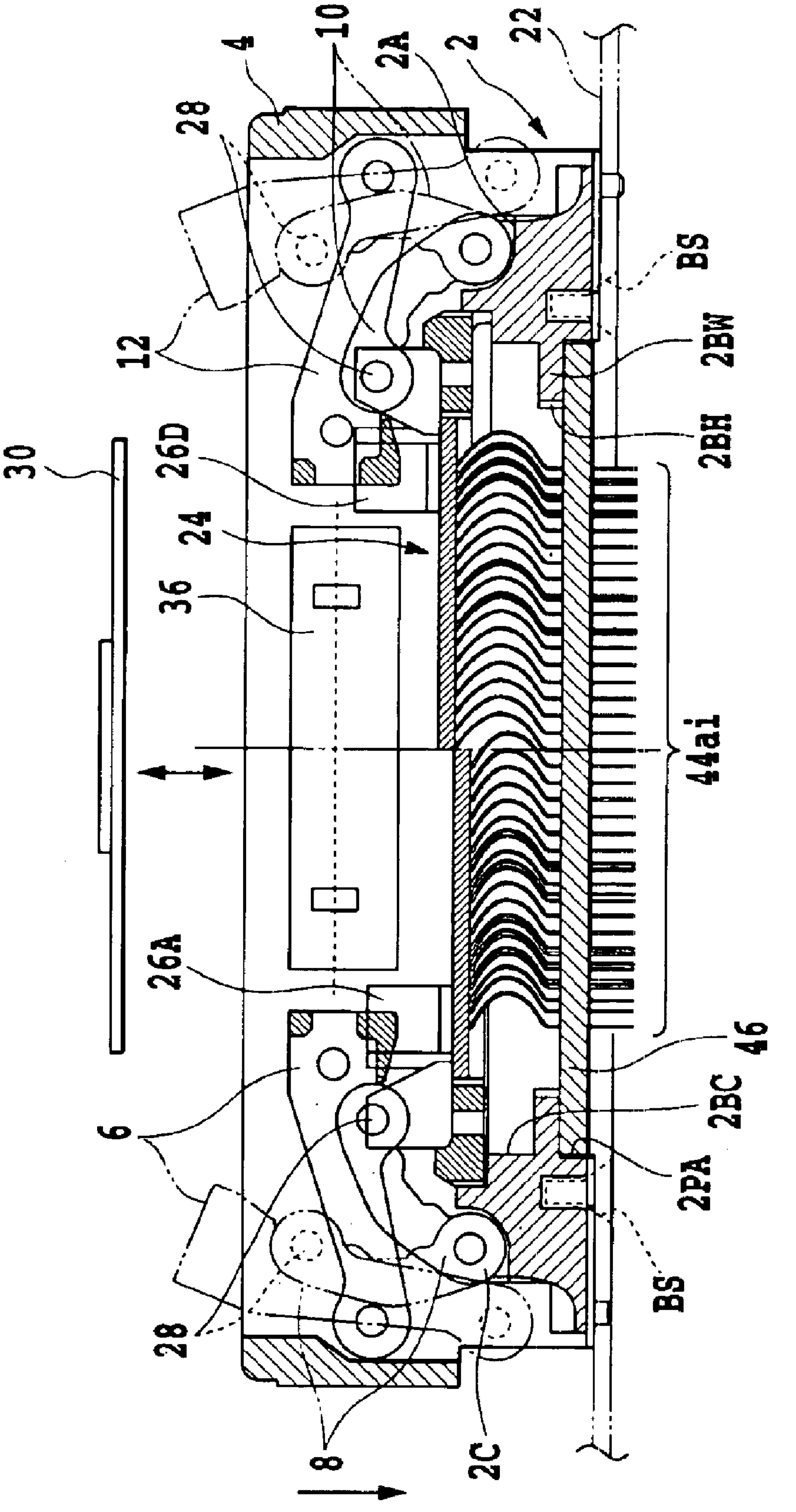
FIG. 4 is a schematic front view showing a constitution of the semiconductor device socket shown in FIG. 3.

FIGS. 3 and 4 illustrate a total structure of a semiconductor device socket to which is applied one embodiment of the method for assembling a semiconductor device socket in accordance with the present invention.

In FIG. 3, a plurality of semiconductor device sockets are arranged at predetermined positions on a printed circuit board 22, for example, in the vertical and horizontal directions. The semiconductor device socket includes a socket body 2 having a object under test accommodating portion for accommodating the tested semiconductor device, a cover member 4 movable upward and downward relative to the socket body 2, and pressing members 34, 36, 38 and 40 for pressing a terminal section of the object under test located in the object under test accommodating portion onto a group of contact pins electrically connected to a electrode section of the printed circuit board 22 at a predetermined pressure.

Groups of electrodes are formed on the printed circuit board 22 in correspondence to the respective socket bodies 2. The respective electrode group is electrically connected to a signal input/output section of the printed circuit board 22 for inputting and outputting of an inspection signal via an electro-conductive layer not illustrated.

For example, as shown in FIG. 4, a semiconductor device 30 to be tested is formed of a semiconductor element, in the interior of which is formed an electronic circuit, and a wiring board electrically connected to the semiconductor element, and is a so-called semifinished product. The wiring board has a group of connection terminals on a surface opposed to the above-mentioned contact pin group.

Figure 5:
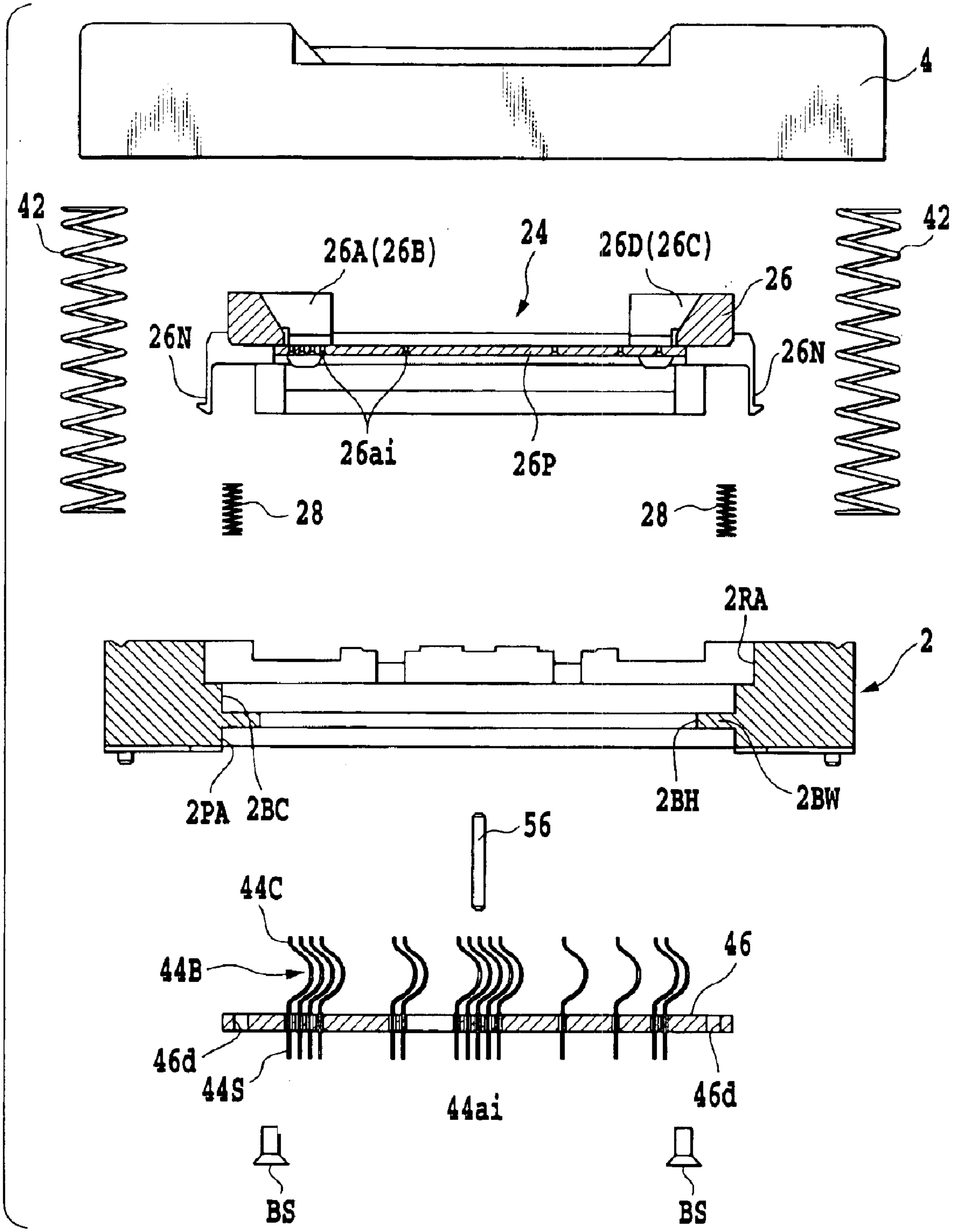
FIG. 5 is an exploded view of the semiconductor device socket shown in FIG. 3, in which main constituent elements are illustrated.

The socket body 2 molded with resin has a object under test accommodating portion 24 generally in a central region thereof, for accommodating the semiconductor device 30 as an object under test. The object under test accommodating portion 24 has a recess, for example, of a generally square shape. The recess of the object under test accommodating portion 24 is formed of a positioning member 26 as shown in FIG. 5. The positioning member 26 is arranged in a positioning member accommodating portion 2RA in the socket body 2.

The positioning member 26 has positioning sections 26A, 26B, 26C and 26D at four corners thereof, respectively. The positioning sections 26A, 26B, 26C and 26D carry out the relative positioning operation with respect to contact pins of the connecting terminals of the semiconductor device 30, and have engaging portions engageable with four corners of the wiring board of the semiconductor device 30.

As shown in FIG. 5, the positioning sections 26A, 26B, 26C and 26D are coupled with each other by a flat plate section 26P having a plurality of holes 26*ai* (i=1 to n; n is a positive integer) arranged in the vertical and horizontal directions. Accordingly, the flat plate section 26P forms a bottom portion of the positioning member 26. On each of outer circumferential sides of the flat plate section 26P, nibs 26N engaged with the socket body 2 are provided, for example, at two positions. The holes 26*ai* are formed at a gap in correspondence to the arrangement of the connecting terminals of the semiconductor device 30 and contact pins described later.

The hook 26N of the positioning member 26 is held so that the positioning member 26 is movable by a predetermined stroke in the rising and descending directions of the cover member 4 within the positioning member accommodating portion 2A of the socket body 2.

As shown in FIG. 5, four coil springs 28 for biasing the positioning member 26 away from the bottom of the positioning member accommodating portion 2RA are uniformly arranged between a surface of the flat plate section 26P of the positioning member 26 opposed to the positioning member accommodating portion 2RA of the socket body 2 and the bottom of the positioning member accommodating portion 2RA. In this regard, in FIG. 5, only two coil springs 28 are shown as representatives.

As shown in FIG. 3, there are support sections 2B and 2D for supporting one ends of arm members 14 and 18 described later in a rotatable manner at two positions on one of opposite sides of the socket body 2, respectively.

The one ends of the arm members 14 and 18 are coupled to inner walls of tip end portions of pressing member-supporting members 16 and 20, respectively, by means of a connecting pin 28.

Further, as shown in FIG. 3, there are support sections 2C and 2A for supporting one ends of arm members 8 and 10 described later in a rotatable manner at two positions on the other of the opposite sides of the socket body 2, respectively.

The one ends of the arm members 8 and 10 are coupled to inner walls of tip end portions of pressing member-supporting members 6 and 12, respectively, by means of a connecting pin 28.

The pressing bodies 36 and 40 for pressing one of opposed sides of an upper surface of the wiring substrate of the mounted semiconductor device 30 toward the contact pin group are provided at tip ends of the pressing member-supporting members 16 and 20 farther forward from portions coupled to one ends of the arm members 14 and 18. Also, the pressing body 34 and 38 for pressing the other of opposed sides of an upper surface of the wiring substrate of the mounted semiconductor device 30 toward the contact pin group are provided at tip ends of the pressing member-supporting members 6 and 12 farther forward from portions coupled to one ends of the arm members 8 and 10. Proximal ends of the presser member-supporting members 6 and 12 and proximal ends of the presser member-supporting members 16 and 20 are coupled to the inner circumference of the cover member 4 in a oscillatable manner.

There are coil springs 42 for biasing the cover member 4 away from the socket body 2; i.e., in the upward direction; between four corners of the periphery of the object under test accommodating portion 24 in the socket body 2 and the inner circumference of the cover member 4.

As shown in FIG. 3, the cover member 4 encircling the upper portion of the object under test accommodating portion 24 has an opening 4*a* at a center thereof for allowing the positioning member 26 or the semiconductor device 30 selectively to pass through the same, and is supported to be movable upward and downward relative to the socket body 2.

Accordingly, when the cover member 4 is pressed against the bias of the coil springs 42 in the direction indicated by an arrow in FIG. 4; i.e., closer to the socket body 2, the pressing member-supporting members 6, 12 and the pressing member-supporting members 16, 20 are in the upright position state as shown by a chain double-dashed line in FIG. 4, and the pressing members 34, 38 and the pressing bodies 36, 40 are away from each other to occupy the waiting position, whereby the upper side of the object under test accommodating portion 24 is open. In this regard, FIG. 4 illustrates that the cover member 4 is at the uppermost position. As a result, it is possible to attach and detach the semiconductor device 30 relative to the object under test accommodating portion 24.

On the other hand, as shown in FIG. 4, when the cover member 4 is at the uppermost position, the biasing force of the coil springs 42 is transmitted to the pressing member-supporting members 16 and 20 via predetermined transmitting members and the coupling ends of the arm members 14 and 18 are made to move rotationally, whereby the pressing bodies 36 and 40 thereof are brought into contact with the wiring substrate of the semiconductor device 30 at a predetermined pressure. Also, the pressing bodies 34 and 38 are brought into contact with the wiring substrate of the semiconductor device 30 at a predetermined pressure.

As shown in FIG. 4, on the bottom of the positioning member accommodating portion 2RA of the socket body 2, there is a step height portion 2BC of a predetermined depth. In the bottom wall 2BW of the step height portion 2BC, there is an opening 2BH. Curved portions of a plurality of contact pins 44*ai* (i=1 to n; i is a positive integer) are inserted into the step height portion 2BC and the opening 2BH.

On the printed circuit board 22 side of bottom wall 2BW, there is a supporting plate accommodating portion 2PA for accommodating a contact pin supporting plate 46. The supporting plate accommodating portion 2PA is communicated with the step height portion 2BC through the opening 2BH and opens to the bottom surface of the socket body 2. The bottom surface of the socket body 2 is fixed to the printed circuit board 22, for example, by a plurality of countersunk screws BS screwed into female type threaded holes in the socket body 2.

As shown in FIGS. 4 and 5, the contact pin 44*ai* is made of a thin metal sheet of a uniform thickness and includes a stationary terminal section 44S to be soldered to the electroconductive layer of the printed circuit board 22, a contact point 44C to be selectively brought into contact with the electrode section of the semiconductor device 30 via the hole 26*ai* of the positioning member 26 and a curved section 44B coupling the stationary terminal section 44S with the contact point 44C.

Figures 1A, 1B, 1C:
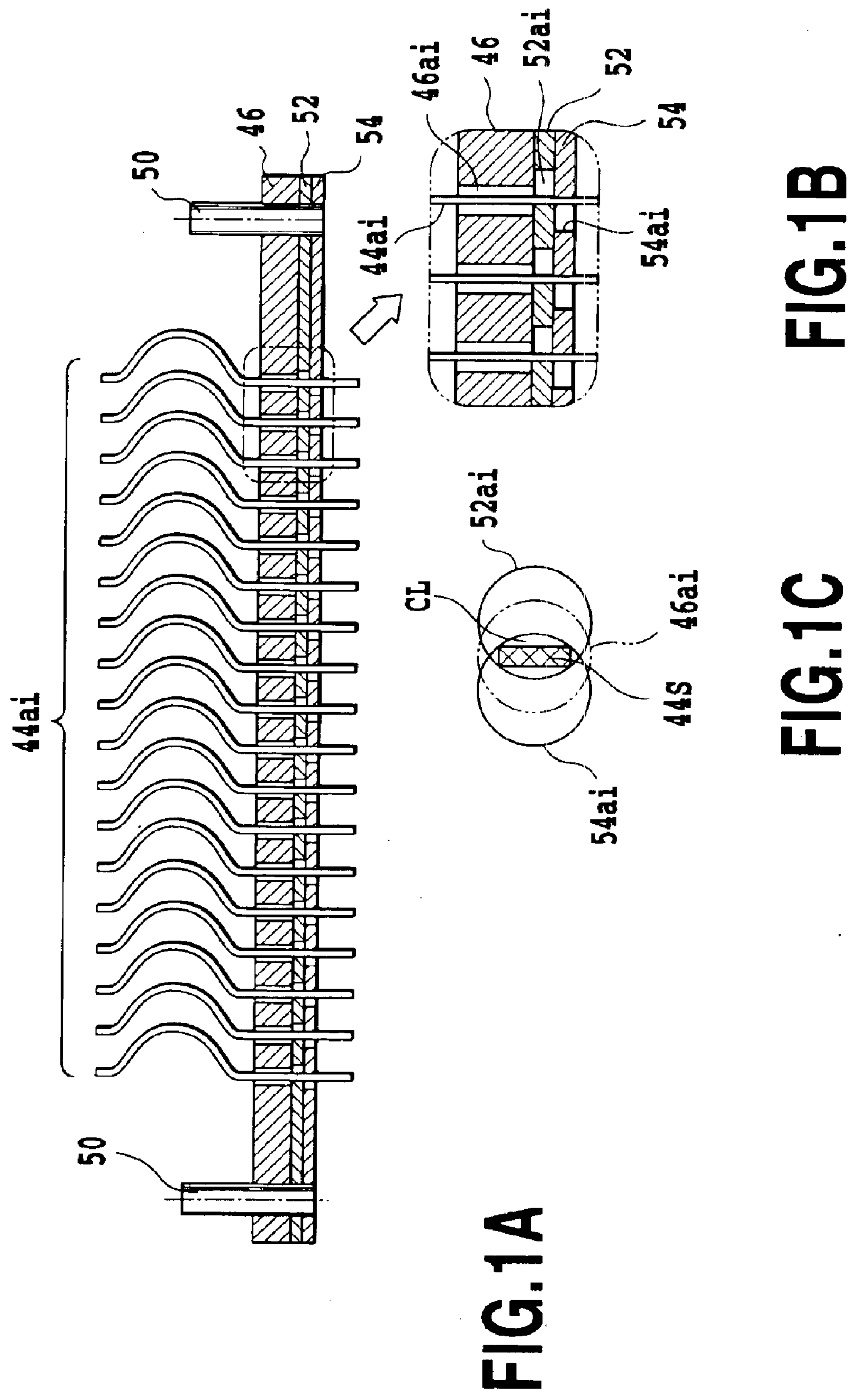
FIG. 1A is a partial sectional view for explaining an assembling process of contact pins in one embodiment of the method for assembling a semiconductor device socket in accordance with the present invention.
FIG. 1B is an enlarged partially sectional view showing a main part of the embodiment shown in FIG. 1A.
FIG. 1C is a schematic plan view illustrating the arrangement relationship of holes in the embodiment shown in FIG. 1B.
Figure 2:
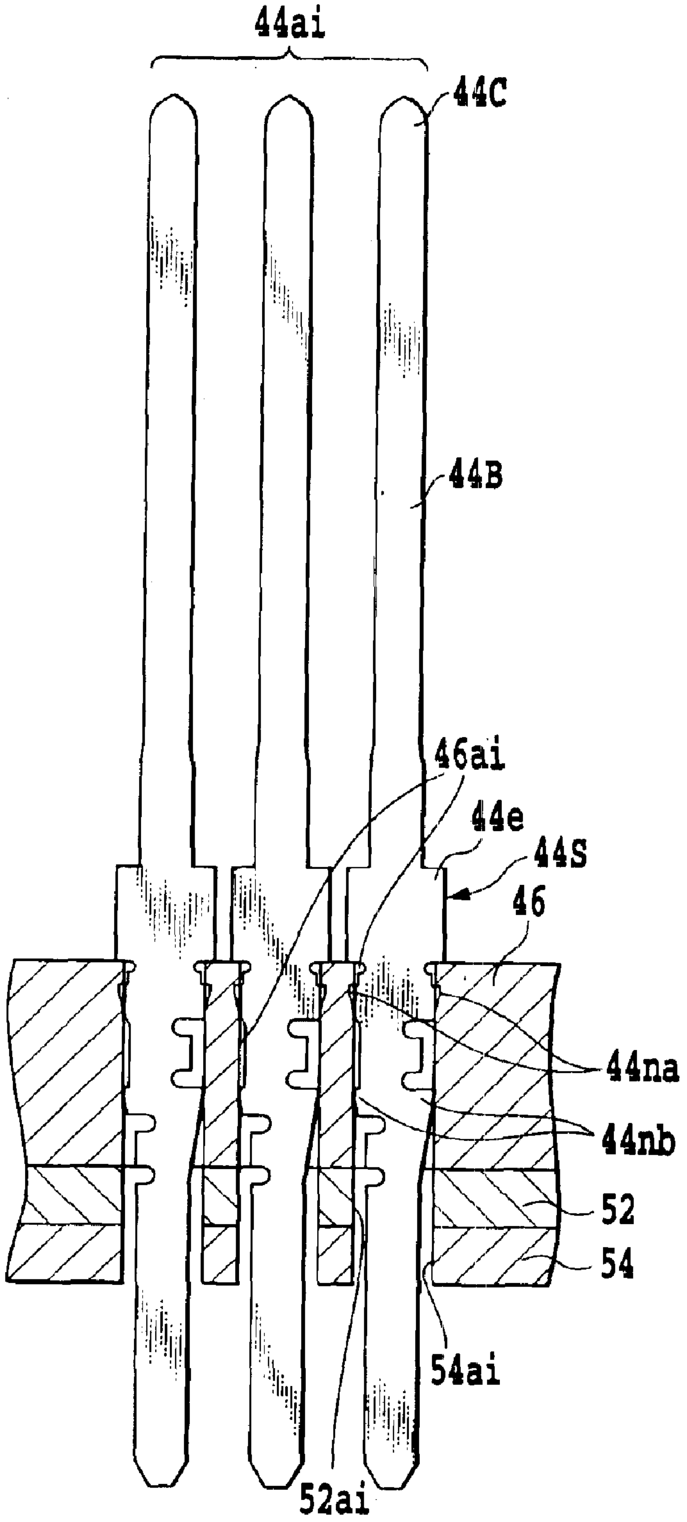
FIG. 2 is an enlarged partially sectional view of a part shown in FIG. 1A as seen from a lateral side.

As shown in FIG. 2 in an enlarged manner, the stationary terminal section 44S is press-fit into an attachment hole 46*ai* of a contact pin supporting plate 46 described later. The stationary terminal section 44S has an enlarged portion 44*e* brought into contact with the peripheral edge of an opening end of the attachment hole 46*ai* when press-fit and a pair of nibs 44*na* and 44*nb* engageable with the inner circumferential wall of the attachment hole 46*ai*. The nibs 44*na* and 44*nb* are integral with a portion contiguous to the enlarged portion at a predetermined distance along the axial direction of the contact pin 44*ai*. A thickness of the stationary terminal section 44S is smaller than a diameter of the above-mentioned attachment hole 46*ai* as shown in FIG. 1A.

The contact point 44C is inserted into the hole 26*ai* of the above-mentioned positioning member 26 at a predetermined gap. Accordingly, the contact pin 44*ai* is provided generally at the vertical position relative to a plane of the contact pin supporting plate 46 and the printed circuit board 22 while the contact point 44C and the stationary terminal section 44S are supported.

The curved section 44B of the contact pin 44*ai* has the elasticity and is deformable in accordance with the pressing force applied to the positioning member 26.

Figure 6:
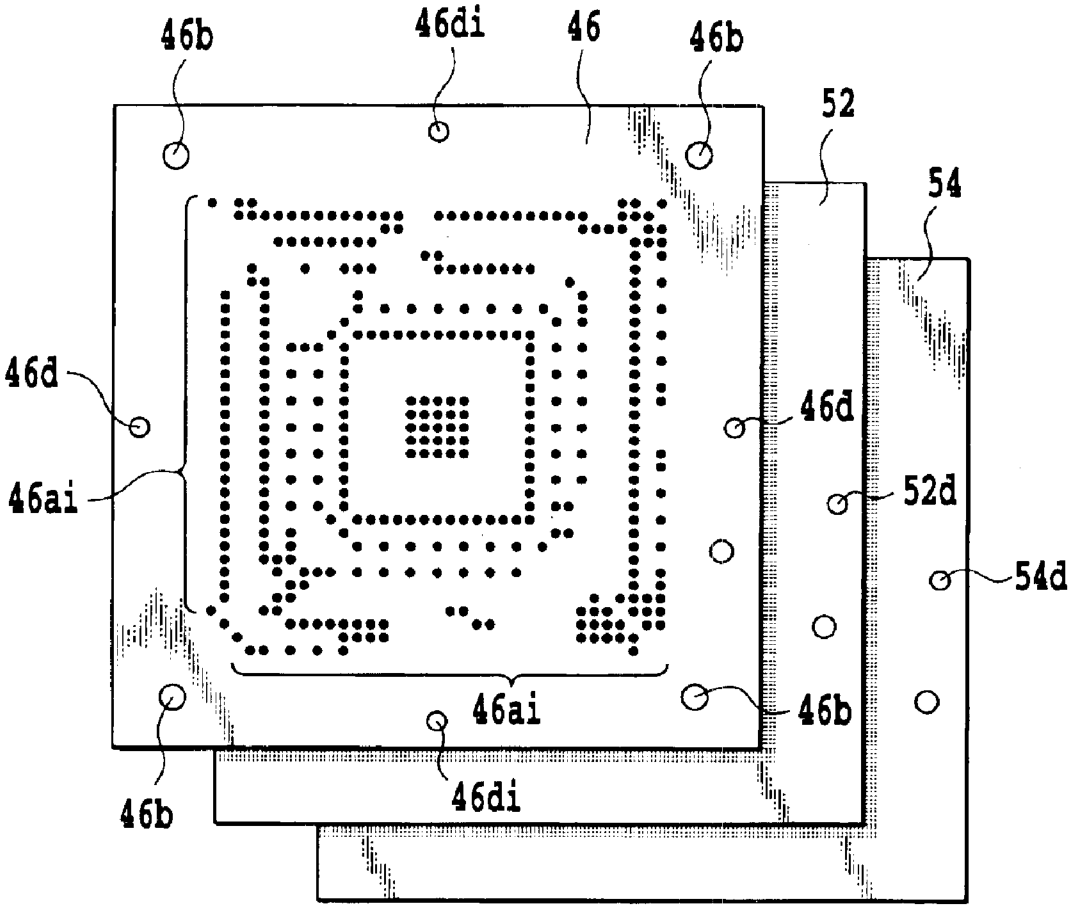
FIG. 6 is a plan view showing first and second position-restricting plates together with a contact pin supporting plate used in the embodiment of the inventive method for assembling a semiconductor device socket.

The contact pin supporting plate 46 of approximately 1.3 mm thick has attachment holes 46*b* at the respective corners around a group of the attachment holes 46*ai* as shown in FIG. 6. A screw (not shown) is inserted into the respective hole 46*b* to fix the contact pin supporting plate 46 onto the supporting plate accommodating portion 2PA.

A pair of holes 46*d* is provided at an intermediate position between the respective pair of holes 46*b* in the contact pin supporting plate 46, into which is inserted a positioning pin 50 when the assembly is carried out.

In a central region encircled by the above-mentioned holes 46*b* and 46*d*, the holes 46*ai* are arranged in the vertical and horizontal directions, through which are inserted the stationary terminal sections 44S of the contact pins 44*ai*.

In such a structure, when the semiconductor device 30 held, for example, by a robot hand not shown is accommodated in the object under test accommodating portion 24 through the opening 4*a* of the cover member 4 upon the attachment of the semiconductor device 30 onto the socket body 2, the cover member 4 is first lowered against the biasing force of the coil springs 42 by the robot hand not shown. At this time, the pressing members 34, 36, 38 and 40 are away from the object under test accommodating portion 24 and kept in an upright position state.

Then, the semiconductor device 30 is placed in the positioning member 26 and located there, whereby the electrode sections of the semiconductor device 30 are positioned relative to the contact pins 44*ai*.

When the cover member 4 moves upward by the robot hand not shown and stops at a position shown in FIG. 4, the wiring substrate of the semiconductor device 30 is pushed toward the contact pins 44*ai* by the moved rotationally pressing members 34, 36, 38 and 40 as shown by a solid line in FIG. 4.

Thereafter, a predetermined test signal is fed to the semiconductor device 30 via the printed circuit board 22 and the test of the semiconductor device 30 is executed.

When the tested semiconductor device 30 is removed from the semiconductor socket after the test has been finished, the cover member 4 is lowered again as described above by the robot hand not shown, and then the tested semiconductor device 30 is removed from the object under test accommodating portion 24.

Upon the assembly of the semiconductor socket, the positioning members 26 are first attached to the socket body 2 while interposing the respective coil springs 28 between them.

Figure 7:
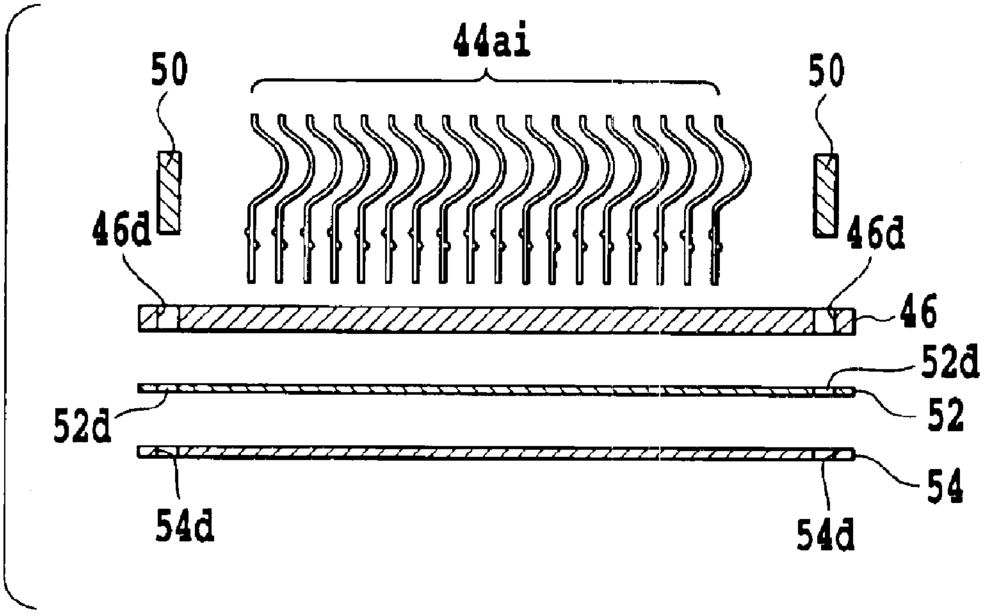
FIG. 7 is a view made available for explaining a process for assembling contact pins in the inventive method for assembling a semiconductor device socket.

Then, the contact pins 44*ai* are arranged on the contact pin supporting plate 46 by using first position-restricting plate 52 and a second position-restricting plate 54 shown in FIGS. 6 and 7.

Figure 8:
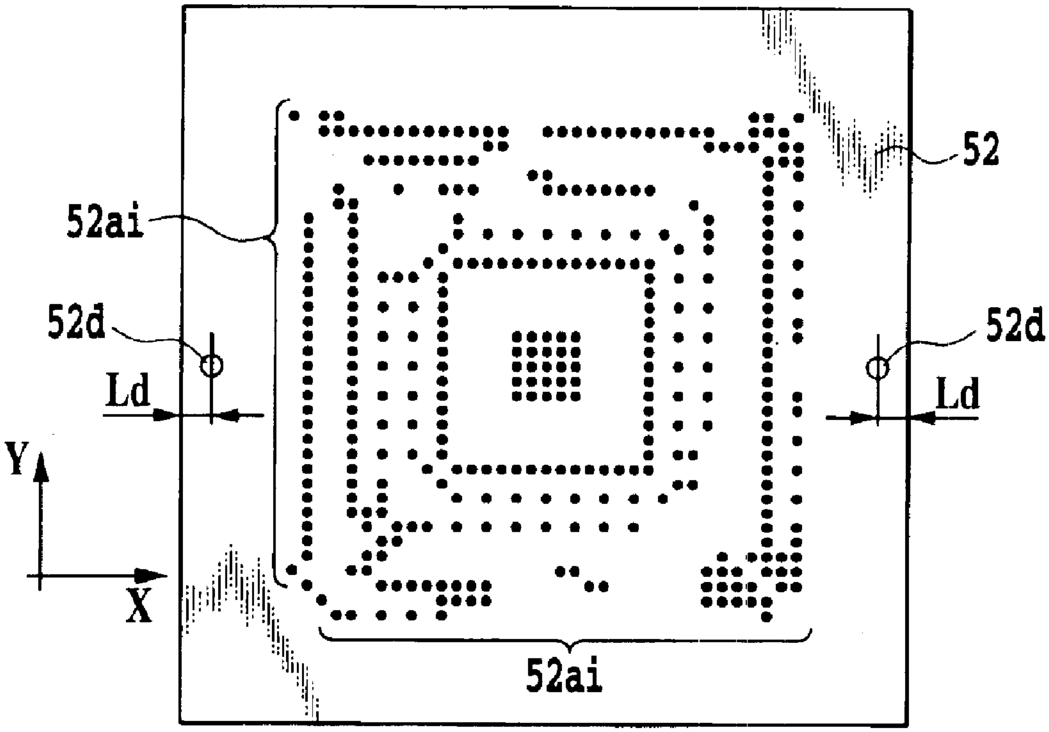
FIG. 8 is a plan view of the first position-restricting plate used in the embodiment of the inventive method for assembling a semiconductor device socket.

The first position-restricting plate 52 used is formed, for example, by a resinous sheet of approximately 0.5 mm thick to have the same profile dimension as that of the contact pin supporting plate 46 as shown in FIG. 8. In the first position-restricting plate 52, there are holes 52*d* at positions corresponding to the respective holes 46*d* of the contact pin supporting plate 46. A distance Ld from a center of the hole 52*d* to an edge of the plate 52 is set to be equal to a distance from the respective hole 46*d* of the contact pin supporting plate 46 to an edge thereof. Also, holes 52*ai* (i=1 to n; n is a positive integer) in which are inserted the stationary terminal sections 44S of the respective contact pins 44*ai* are formed between the holes 52*d* of the first position-restricting plate 52. A diameter of the hole 52*ai* is set to be equal to a diameter of the hole 46*ai* of the contact pin supporting plate 46. Center positions of the respective holes 52*ai* arranged in the X direction shown in FIG. 8; i.e., center positions arranged in the direction parallel to the center axis of the first position-restricting plate 52 passing the holes 52*d*; are shifted rightward at a predetermined distance from positions of the corresponding holes 46*ai* in the contact pin supporting plate 46 to the end side thereof (see FIG. 1B). The predetermined distance is, for example, slightly smaller than approximately half a diameter of the hole 46*ai* in the contact pin supporting plate 46. On the other hand, positions of the respective holes 52*ai* arranged in the Y direction orthogonal to the X direction shown in FIG. 8 are the same as those of the corresponding holes 46*ai* in the contact pin supporting plate 46.

Figure 9:
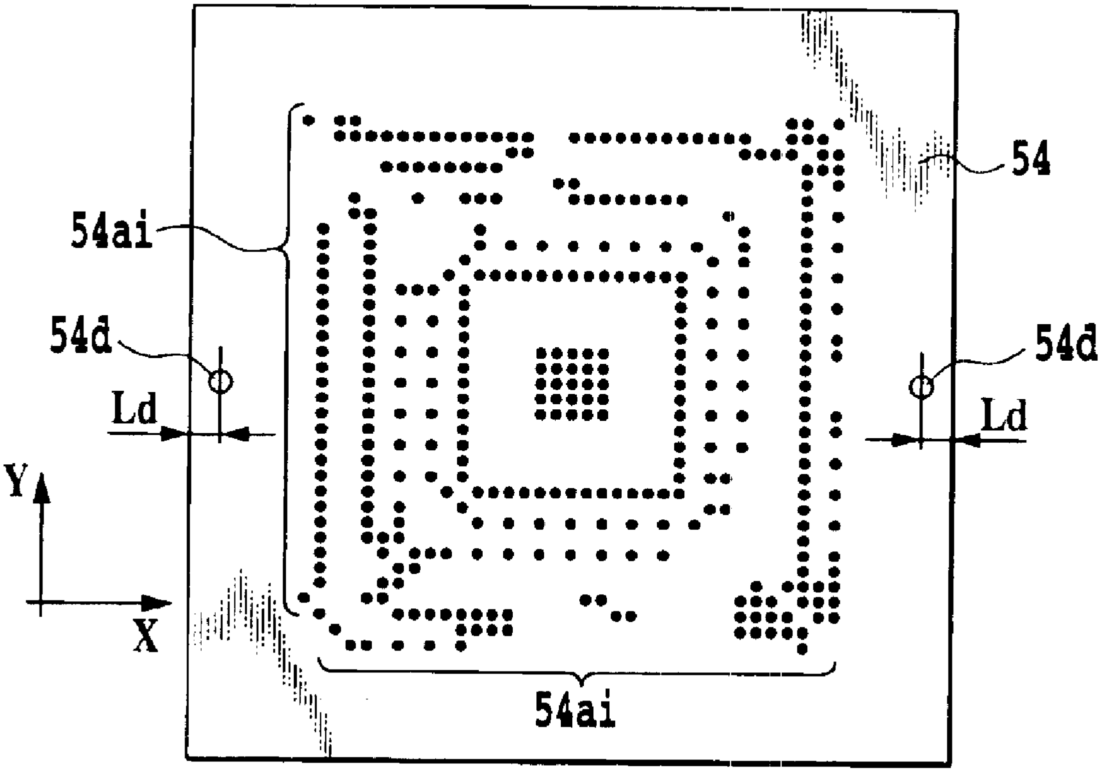
FIG. 9 is a plan view of the second position-restricting plate used in the embodiment of the inventive method for assembling a semiconductor device socket.

As shown in FIG. 9, the second position-restricting plate 54 used is formed, for example, by a resinous sheet of approximately 0.5 mm thick to have the same profile dimension as that of the contact pin supporting plate 46 in a similar manner as in the first position-restricting plate 52. In the second position-restricting plate 54, as shown in FIG. 9, there are holes 54*d* at positions corresponding to the respective holes 46*d* of the contact pin supporting plate 46. A distance Ld from a center of the hole 54*d* to an edge of the plate 54 is set to be equal to a distance from the respective hole 46*d* of the contact pin supporting plate 46 to an edge thereof. Also, holes 54*ai* (i=1 to n; n is a positive integer) in which are inserted the stationary terminal sections 44S of the respective contact pins 44*ai* are formed between the holes 54*d* of the second position-restricting plate 54. A diameter of the hole 54*ai* is set to be equal to a diameter of the hole 46*ai* of the contact pin supporting plate 46. Center positions of the respective holes 54*ai* arranged in the X direction shown in FIG. 8; i.e., center positions arranged in the direction parallel .to the center axis of the second position-restricting plate 54 passing the holes 54*d*; are shifted leftward at a predetermined distance from positions of the corresponding holes 46*ai* in the contact pin supporting plate 46 to the end side thereof (see FIG. 1B). The predetermined distance is, for example, slightly smaller than approximately half a diameter of the hole 46*ai* in the contact pin supporting plate 46. On the other hand, positions of the respective holes 54*ai* arranged in the Y direction orthogonal to the X direction shown in FIG. 8 are the same as those of the corresponding holes 46*ai* in the contact pin supporting plate 46.

Upon using the first position-restricting plate 52 and the second position-restricting plate 54, as shown in FIGS. 6 and 7, after the first position-restricting plate 52 and the contact pin supporting plate 46 are sequentially overlaid on the second position-restricting plate 54, the positioning pins 50 are inserted into the holes 46*d*, 52*d* and 54*d* as shown in FIG. 1A.

Then, as shown in FIGS. 1B and 1C in an enlarged manner, a tip end of the stationary terminal section 44S of the contact pin 44*ai* is inserted into a gap CL commonly formed by the holes 52*d* and 54*d* through the holes 46*ai* of the contact pin supporting plate 46. The gap CL is formed by two arcs.

At this time, as shown in FIG. 7, the contact pins 44*ai* are inserted so that the curved sections 44B of the adjacent contact pins 44*ai* are oriented in the same direction. Accordingly, since a tip end of the stationary terminal section 44S in the contact pin 44*ai* having a generally rectangular cross-section is nipped by the peripheral edges of the gap CL common to the holes 52*d* and 54*d* without needing the press-fitting operation, the contact pins 44*ai* are easily located without rotating and falling down. As a result, it is possible to facilitate the positional accuracy of the contact pins 44*ai* as well as to improve the efficiency of the assembly operation since the troublesome positional adjustment is eliminated.

Subsequently, the tip end of the stationary terminal section 44S of the respective contact pin 44*ai* arranged on the contact pin supporting plate 46 is pulled so that the pair of nibs 44*na* and 44*nb* are engaged with the inner peripheral edge of the attachment hole 46*ai* as shown n FIG. 2. Thereby, as shown in FIG. 2, the enlarged portion 44*e* of the respective contact pin 44*ai* is brought into contact with the surface of the contact pin supporting plate 46.

Subsequently, as shown in FIG. 5, after the positioning pin 50, the first position-restricting plate 52 and the second position-restricting plate 54 have been removed from the contact pin supporting plate 46, positioning pins 56 are press-fit into the holes 46*di* of the contact pin supporting plate 46 on which are arranged the contact pins 44*ai*. As shown in FIG. 4, the contact pin supporting plate 46 on which are fixed the positioning pins 56 is fixed in the supporting plate accommodating portion 2PA of the socket body 2 by screws.

After the coil springs 42 have been located at the predetermined positions in the socket body 2, the cover member 4 assembled with the pressing members 34, the pressing member-supporting members 6, the arm members 8 or others is attached to the socket body 2.

Thus, the semiconductor device socket is completed. Thereafter, the socket body 2 is fixed to the printed circuit board 22 with screws BS.

In this regard, according to the above-mentioned embodiment, for the purpose of forming the common gap CL between the contact pin supporting plate 46, the first position-restricting plate 52 and the second position-restricting plate 54, the holes 52*ai* and 54*ai* are formed in the first position-restricting plate 52 and the second plate restricting plate 54, respectively, at positions shifted leftward or rightward at the predetermined distance in the X direction in FIGS. 8 and 9. The present invention, however, should not be limited thereto. Alternatively, the common gap CL may be formed by shortening a distance Ld between the center of the right hole 52*d* of the first position-restricting plate 52 and the edge of the plate by a predetermined value while maintaining the position of the hole 52*ai* and the distance between the centers of the two holes 52*d* as they are, and by shortening a distance Ld between the center of the left hole 54*d* of the second position-restricting plate 54 and the edge of the plate by a predetermined value, while maintaining the position of the hole 54*ai* and the distance between the centers of the two holes 54*d* as they are.

FIGS. 10A–10D to 16A–16B illustrate main part of another embodiment of the inventive method for assembling a semiconductor device socket.

In the embodiment shown in FIGS. 10A–10D and FIGS. 11A and 11B, contact pins 66 are arranged on a contact pin supporting plate 60 by using a first position-restricting plate 62 and a-second position-restricting plate 64 during the above-mentioned assembly process for a semiconductor device socket.

Figure 11A:
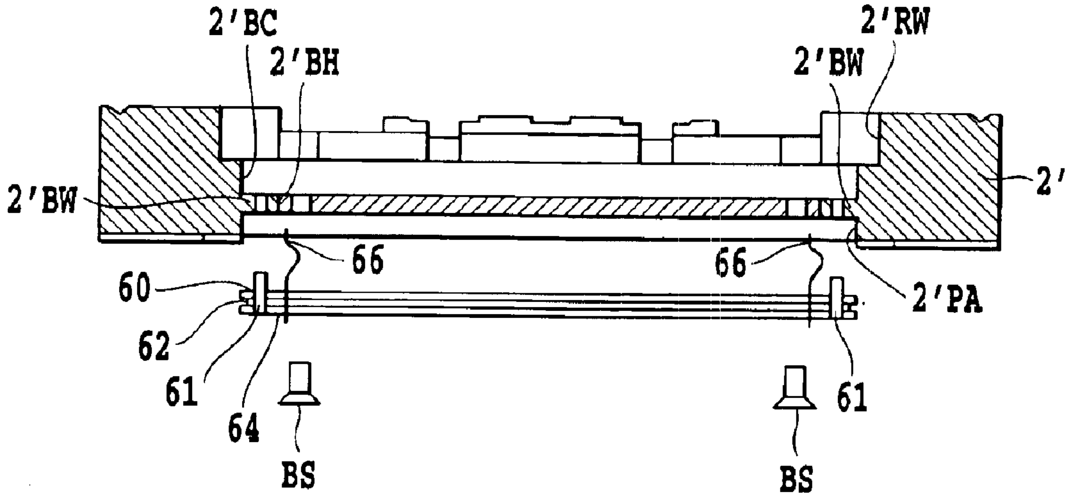
FIGS. 11A and 11B are views made available for illustrating the assembly process in the embodiment shown in FIGS. 10A to 10D.
Figure 11B:
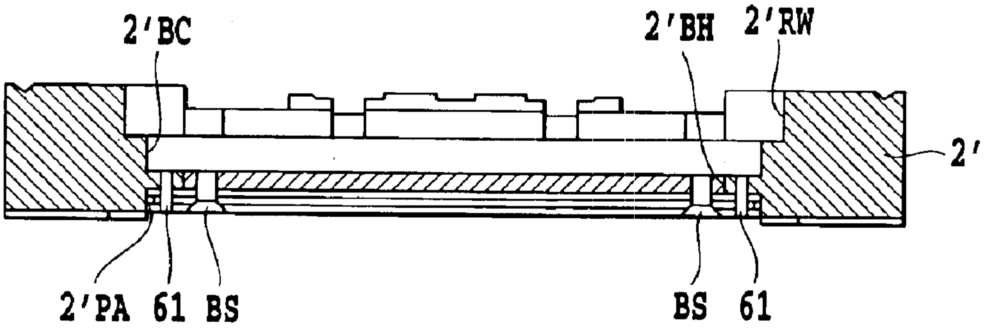

In the embodiment shown in FIGS. 11A and 11B, a step height portion 2'BC having a predetermined depth is formed on the bottom of a positioning member accommodating portion 2'RA in a socket body 2'. There is an opening 2'BH in a bottom wall 2'BW of the step height portion 2'BC. On a lower surface side of the bottom wall 2'BW, there is a supporting plate accommodating portion 2'PA for accommodating a contact pin supporting plate 60, a first position-restricting plate 62 and a second position-restricting plate 64. The supporting plate accommodating portion 2'PA is communicated with the step height portion 2'BC via the opening 2'BH and opened to a bottom of the socket body 2'. The bottom of the socket body 2' is fixed to the printed circuit board 22, for example, by a plurality of countersunk screws screwed into female type threaded holes in the socket body 2' through holes not shown of the printed circuit board 22.

Figure 10A:
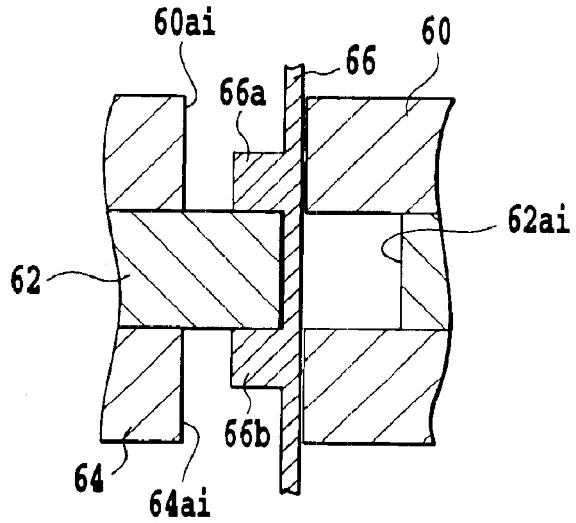
FIG. 10A is a partially sectional view illustrating a process for assembling contact pins in the method for assembling a semiconductor device socket in accordance with the present invention.
Figure 10B:
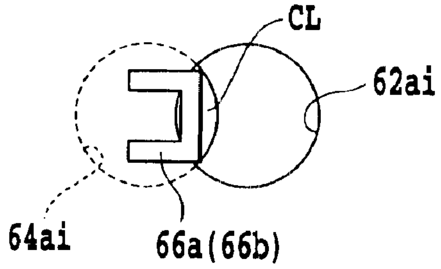
FIG. 10B is a plan view schematically illustrating the arrangement relationship of the hole in the portion shown in FIG. 10A.
Figure 10C:
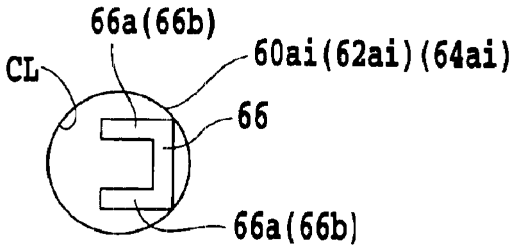
FIGS. 10C and 10D are a schematic view and a partially sectional view, respectively, for illustrating the process for assembling the contact pin in the embodiment shown in FIG. 10A.
Figure 10D:
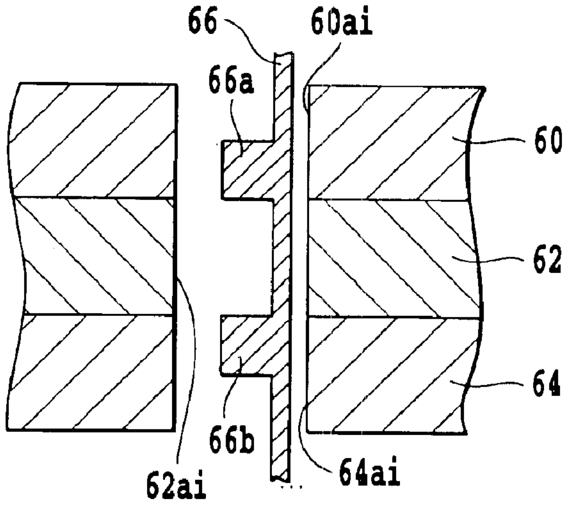

When the contact pins 66 are arranged on the contact pin supporting plate 60, as shown in FIGS. 10C and 10D, first, the first position-restricting plate 62 and the contact pin supporting plate 60 are sequentially positioned and overlaid on the second position-restricting plate 64, and thereafter, tip ends of the stationary terminal sections of the respective contact pins 66 are inserted into common gaps CL formed by holes 62*ai* (i=1 to n; n is a positive integer) of the first position-restricting plate 62 and holes 64*ai* (i=1 to n; n is a positive integer) of the second position-restricting plate 64 through holes 60*ai* (i=1 to n; n is a positive integer) of the contact pin supporting plate 60, and held there (see FIG. 10B). In the stationary terminal section of the contact pin 66, there are a pair of engaging portions 66*a* and 66*b* of a U-shaped cross-section and engageable with the peripheral edge of the hole 62*ai*. As shown in FIG. 10D, the engaging portions 66*a* and 66*b* are opposed to each other at a predetermined distance between the both.

Next, as shown in FIGS. 10A and 10B, after the first position-restricting plate 62 has been shifted at a predetermined distance relative to the contact pin supporting plate 60 and the second position-restricting plate 64, the contact pin supporting plate 60, the first position-restricting plate 62 and the second position-restricting plate 64 are integrated with each other by the press-fit of a plurality of positioning pin 61 into common holes in the contact pin supporting plate 60, the first position-restricting plate 62 and the second position-restricting plate 64 as shown in FIG. 11A. In this regard, the common holes are provided in the contact pin supporting plate 60, the first position-restricting plate 62 and the second position-restricting plate 64, respectively. The arrangements and positions of the holes 60*ai* in the contact pin supporting plate 60, the holes 62*ai* in the first position-restricting plate 62 and the holes 64*ai* in the second position-restricting plate 64 are the same as those in the preceding embodiment.

At this time, the engaging portion 66*a* is engaged with the open end peripheral edge of the hole 62*ai* on one surface of the first position-restricting plate 62, while the engaging portion 66*b* is engaged with the open end peripheral edge of the hole 64*ai* on the other surface of the second position-restricting plate 64, as shown in FIGS. 10A and 10B. Thereby, the rotation of the stationary terminal section of the respective contact pin 66 is restricted and the axial movement thereof is assuredly restricted.

Subsequently, as shown in FIG. 11B, the assembly of the contact pin supporting plate 60, the first position-restricting plate 62 and the second position-restricting plate 64 is fixed in the supporting plate accommodating portion 2'PA of the socket body 2' by screws BS screwed into female-threaded holes in the socket body 2' through holes in the supporting plate and the position-restricting plates. At this time, tip ends of the plurality of positioning pins 61 are inserted into holes provided on the peripheral edge of the opening 2'BH of the socket body 2.

The assembly process carried out thereafter is the same as described with reference to the preceding embodiment.

Figure 12A:
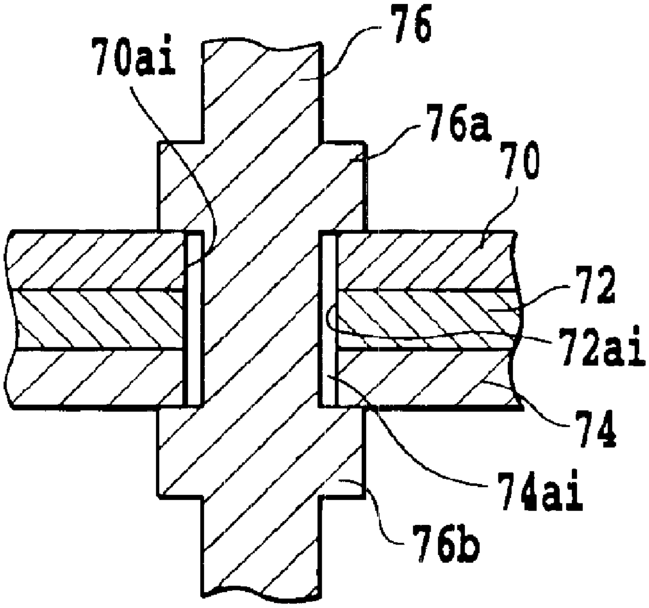
FIGS. 12A and 12B are partially sectional views, respectively, made available for illustrating a process for assembling contact pin in another embodiment of the inventive method for assembling a semiconductor device socket.

In an embodiment shown in FIGS. 12A and 12B, contact pins 76 are arranged in a contact pin supporting plate 70 by using a first position-restricting plate 72 and a second position-restricting plate 74 in the assembly process of the semiconductor device socket described hereinabove. In this regard, the assembly of the contact pin supporting plate 70, the first position-restricting plate 72 and the second position-restricting plate 74 is finally fixed in the supporting plate accommodating portion 2'PA of the socket body 2' by screws BS screwed into female-threaded holes of the socket body 2' through holes of the supporting plate and the position-restricting plates in the same manner as in the preceding embodiment.

A pair of engaging portions 76*a* and 76*b* engageable with the open end peripheral edge of an oval hole 70*ai* of the respective contact pin 76 are formed integral with the stationary terminal section of the contact pin 76 having a generally rectangular cross-section. The engaging portions 76*a* and 76*b* projected in the widthwise direction are disposed away from each other in the axial direction and at a predetermined distance between the both.

A major axis of the oval hole 70*ai* is longer than the widthwise total length of the engaging portion 76*a* or 76*b* of the stationary terminal section in the contact pin 76 described later. On the other hand, a minor axis of the oval hole 70*ai* is slightly shorter than the widthwise length of the engaging portion 76*a* or 76*b* of the stationary terminal section in the contact pin 76. A diameter of the hole 72*ai* of the first position-restricting plate 72 or the hole 74*ai* of the second position-restricting plate 74 is slightly longer than the widthwise length of the engaging portion 76*a* or 76*b* of the stationary terminal section in the contact pin 76.

In this regard, the arrangements and center positions of the oval hole 70*ai* of the contact pin supporting plate 70, the hole 72*ai* of the first position-restricting plate 72 and the hole 74*ai* of the second position-restricting plate 74 are the same as in the above-mentioned embodiment.

When the contact pins 76 are arranged in the contact pin supporting plate 70, first, the first position-restricting plate 72 and the contact pin supporting plate 70 are sequentially overlaid and positioned on the second position-restricting plate. Thereafter, a tip end of the stationary terminal section of the respective contact pin 76 is inserted into common gap formed by the hole 72*ai* (i=1 to n; n is a positive integer) of the first position-restricting plate 72 and the hole 74*ai* (i=1 to n; n is a positive integer) of the second position-restricting plate 74 through the oval hole 70*ai* (i=1 to n; n is a positive integer) of the contact pin supporting plate 70, and is held there.

Figure 12B:
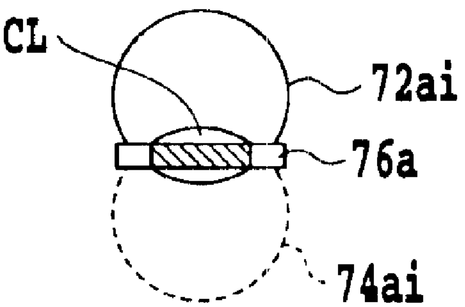

Subsequently, as shown in FIG. 12B, after the first position-restricting plate 72 has been shifted relative to the contact pin supporting plate 70 and the second position-restricting plate 74, the contact pin supporting plate 70, the first position-restricting plate 72 and the second position-restricting plate 74 are integrated with each other by press-fitting positioning pins not shown into common holes.

That is, the engaging portion 76*a* is engaged with the peripheral edge of the hole 70*ai* on the outer surface of the contact pin supporting plate 70, while the engaging portion 76*b* is engaged with the peripheral edge of the hole 74*ai* on the outer surface of the second position-restricting plate 74. Thereby, the rotation of the stationary terminal section of the respective contact pin 76 on its axis as well as the axial movement thereof are prevented.

Sequentially, the assembly of the contact pin supporting plate 70, the first position-restricting plate 72 and the second position-restricting plate 74 is fixed in the supporting plate accommodating portion 2'PA by means of screws BS.

The assembly process thereafter is the same as in the above-mentioned embodiment.

In further embodiments shown in FIGS. 13 to 16A–16B described later, the inventive method for assembling a semiconductor device socket is applied to a semiconductor device socket provided with so-called POGO pins (a registered trade mark) different in structure from the contact pins used in the preceding embodiments.

Figure 13:
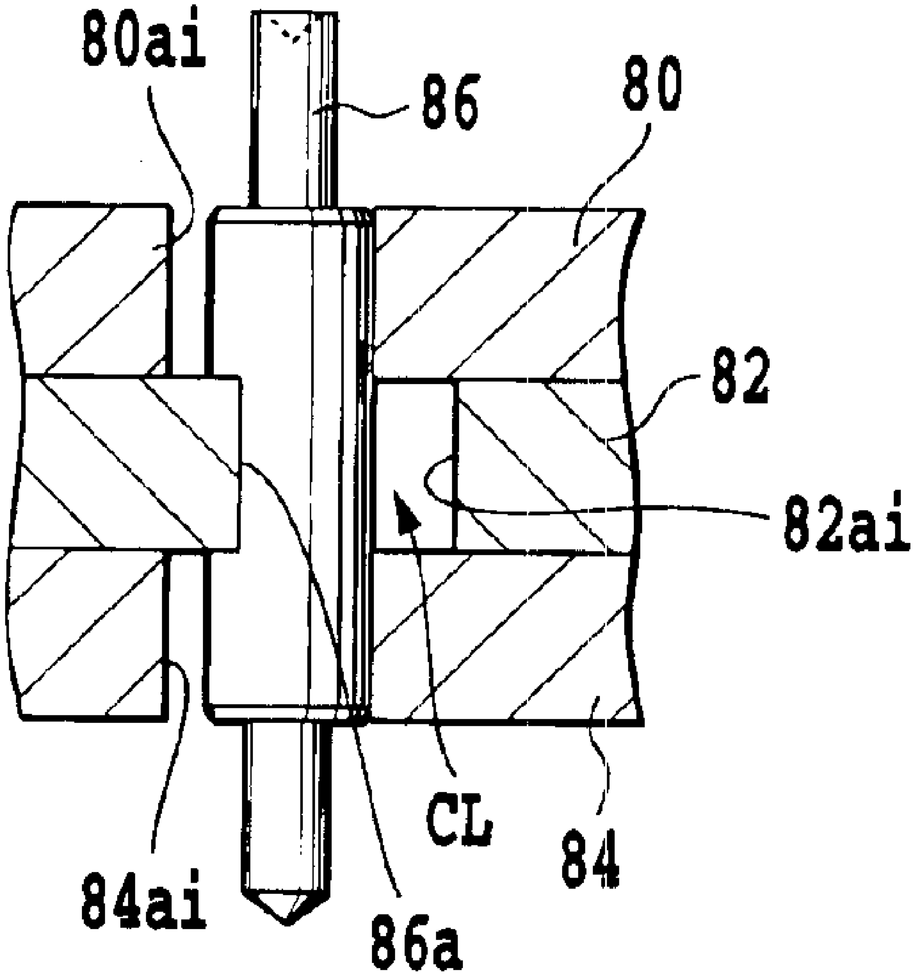
FIG. 13 is a partially sectional view for illustrating a process for assembling contact pins used in a further embodiment of the inventive method for assembling a semiconductor device socket.

In the embodiment shown in FIG. 13, a contact pin 86 has a chamfered portion 86*a* to be engaged with the peripheral edge of a hole 82*ai* of a first position-restricting plate 86*a*. In this regard, a structure of the contact pin 86 is well-known except for an outer tube thereof.

As shown in FIG. 13, during the process for assembling the semiconductor device socket, the respective contact pins 86 are arranged in a contact pin supporting plate 80 while using the first position-restricting plate 82 and a second position-restricting plate 84. The assembly of the contact pin supporting plate 80, the first position-restricting plate 82 and the second position-restricting plate 84 are finally fixed in a supporting plate accommodation section in the socket body by screws screwed into female-threaded holes of the socket body through holes of the supporting plate and the position-restricting plates.

In this regard, the arrangements and center positions of the holes 80*ai* of the contact pin supporting plate 80, the holes 82*ai* of the first position-restricting plate 82 and the holes 84*ai* of the second position-restricting plate 84 are the same as in the embodiment shown in FIG. 1A. Also, diameters of the holes 80*ai*, 82*ai* and 84*ai* are determined to be larger than that of the outer tube of the contact pin 86.

Upon arranging the contact pins 86 in the contact pin supporting plate 80, first, the first position-restricting plate 82 and the contact pin supporting plate 80 are sequentially overlaid on the second position-restricting plate 84 while being positioned to the latter. Thereafter, the respective contact pin 86 is inserted into a common gap CL formed by the hole 82*ai* (i=1 to n; n is a positive integer) of the first position-restricting plate 82 and the hole 84*ai* (i=1 to n; n is a positive integer) of the second position-restricting plate 84 through the hole 80*ai* (i=1 to n; n is a positive integer) of the contact pin supporting plate 80 and held there so that the chamfered portion 86*a* of the stationary terminal section of the contact pin 86 is opposed to the hole 84*ai* (i=1 to n; n is a positive integer) of the second position-restricting plate 84.

Then, as shown in FIG. 13, after the first position-restricting plate 82 has been shifted relative to the contact pin supporting plate 80 and the second position-restricting plate 84, a positioning pin not shown is press-fit into a hole common thereto to complete the assembly.

Accordingly, since steps of the chamfered portion 86*a* in the outer tube of the contact pin 86 are engaged with the chamfered portion of the hole 82*ai* of the first position-restricting plate 82, the rotation of the respective contact pin 86 on its axis as well as the axial movement thereof are prevented.

Subsequently, the contact pin supporting plate 80, the first position-restricting plate 82 and the second position-restricting plate 84 in which the contact pins 86 are arranged are fixed in the supporting plate accommodating portion of the socket body.

The assembly process carried out thereafter is the same as in the above embodiment.

Figure 14:
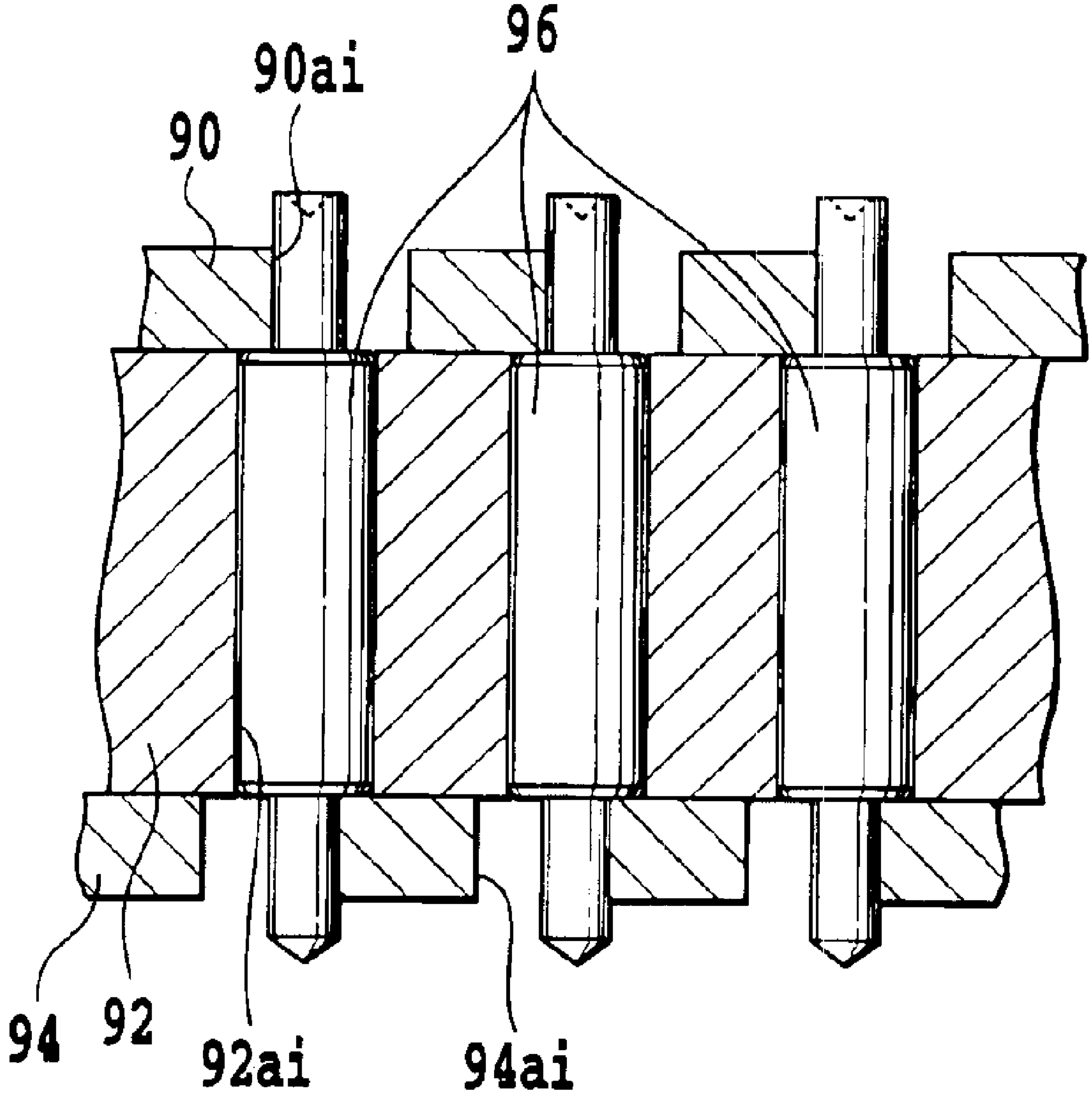
FIG. 14 is a partially sectional view for illustrating a process for assembling contact pins used in a furthermore embodiment of the inventive method for assembling a semiconductor device socket.

In an embodiment shown in FIG. 14, contact pins 96 are arranged in a contact pin supporting plate 90 by using a first position-restricting plate 92 and a second position-restricting plate 94 during the assembly process of the semiconductor device socket described above. In this regard, the assembly of the contact pin supporting plate 90, the first position-restricting plate 92 and the second position-restricting plate 94 is finally fixed in the supporting plate accommodating portion of the socket body by screws screwed into female-threaded holes of the socket body.

In this regard, the arrangements and center positions of the holes 90*ai* of the contact pin supporting plate 90, the holes 92*ai* of the first position-restricting plate 92 and the holes 94*ai* of the second position-restricting plate 94 are the same as in the embodiment shown in FIG. 1A. Also, diameters of the holes 90*ai*, 92*ai* and 94*ai* are determined to be larger than that of the outer tube of the contact pin 96.

Upon attaching the contact pins 96 to the contact pin supporting plate 90, first, the first position-restricting plate 92 and the contact pin supporting plate 90 are sequentially overlaid on the second position-restricting plate 94, while being positioned to the latter. Thereafter, the outer tube of the stationary terminal section of the respective contact pin 96 is inserted into a common gap formed by the hole 92*ai* (i=1 to n; n is a positive integer) of the first position-restricting plate 92 and the hole 94*ai* (i=1 to n; n is a positive integer) of the second position-restricting plate 94 through the hole 90*ai* (i=1 to n; n is a positive integer) of the contact pin supporting plate 90.

Then, as shown in FIG. 14, after the first position-restricting plate 92 and the second position-restricting plate 94 have been shifted relative to the contact pin supporting plate 90 in the same direction, a positioning pin is press-fit into a hole common thereto to integrate the contact pin supporting plate 90, the first position-restricting plate 92 and the second position-restricting plate 94 with each other.

Accordingly, since opposite ends of the outer tube of the contact pin 96 are engaged with the peripheral edge of the hole 90*ai* of the contact pin supporting plate 90 and the peripheral edge of the hole 94*ai* of the second position-restricting plate 94, respectively, the rotation of the contact pin 96 on its own axis is prevented due to frictional force as well as the axial movement thereof is prevented.

Subsequently, the assembly of the positioning pins, the contact pin supporting plate 90 in which are arranged the contact pins 96 and the first and second position-restricting plates 92, 94 is fixed in the supporting plate accommodating portion of the socket body by screws.

The assembly process carried out thereafter is the same as in the above-mentioned embodiment.

Figure 15:
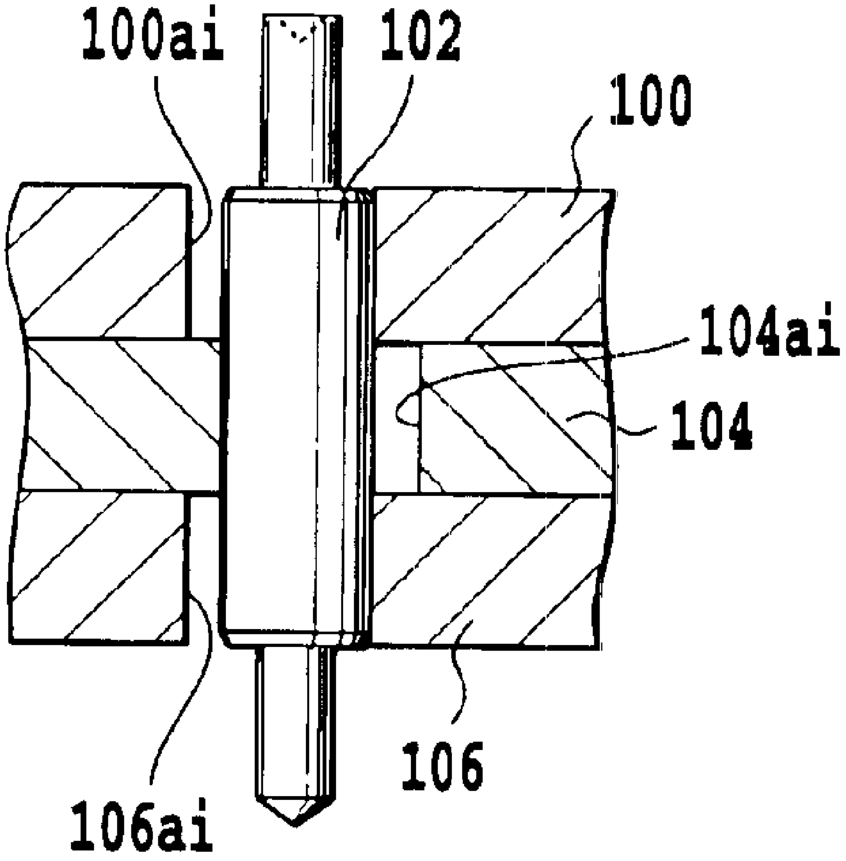
FIG. 15 is a partially sectional view for illustrating a process for assembling contact pins used in a furthermore embodiment of the inventive method for assembling a semiconductor device socket.

In an embodiment shown in FIG. 15, during the above-mentioned assembly process of the semiconductor device socket, contact pins 104 are arranged in a contact pin supporting plate 100 by using a first position-restricting plate 104 and a second position-restricting plate 106. In this regard, the assembly of the contact pin supporting plate 100, the first position-restricting plate 104 and the second position-restricting plate 106 is finally fixed in the supporting plate accommodating portion of the socket body by screws screwed into female-threaded holes of the socket body.

In this regard, the arrangements and center positions of the holes 100*ai* of the contact pin supporting plate 100, the holes 104*ai* of the first position-restricting plate 104 and the holes 106*ai* of the second position-restricting plate 106 are the same as in the embodiment shown in FIG. 1A. Also, diameters of the holes 100*ai*, 104*ai* and 106*ai* are determined to be larger than that of the outer tube of the contact pin 102.

Upon attaching the contact pins 102 to the contact pin supporting plate 100, first, the first position-restricting plate 104 and the contact pin supporting plate 100 are sequentially overlaid on the second position-restricting plate 106, while being positioned to the latter. Thereafter, the-outer tube of the respective contact pin 102 is inserted into a common gap formed by the hole 104*ai* (i=1 to n; n is a positive integer) of the first position-restricting plate 104 and the hole 106*ai* (i=1 to n; n is a positive integer) of the second position-restricting plate 106 through the hole 100*ai* (i=1 to n; n is a positive integer) of the contact pin supporting plate 100.

Then, as shown in FIG. 15, after the first position-restricting plate 104 has been shifted relative to the contact pin supporting plate 100 and the second position-restricting plate 106, a positioning pin is press-fit into a hole common thereto to integrate the contact pin supporting plate 100, the first position-restricting plate 104 and the second position-restricting plate 106 with each other.

Accordingly, since opposite end portions and an intermediate portion of an outer circumference of the outer tube of the contact pin 102 are engaged with an inner circumferential surface of the hole 100*ai* of the contact pin supporting plate 100, an inner lo circumferential surface of the hole 104*ai* of the first position-restricting plate 104 and an inner circumferential surface of the hole 106*ai* of the second position-restricting plate 106, respectively, the rotation of the contact pin 102 on its own axis and the axial movement thereof are prevented due to frictional force.

Subsequently, the assembly of the contact pin supporting plate 100, the first position-restricting plate 104 and the second position-restricting plate 106 in which the contact pins 102 are arranged is fixed in the supporting plate accommodating portion of the socket body by screws.

The assembly process carried out thereafter is the same as in the above-mentioned embodiment.

Figure 16A:
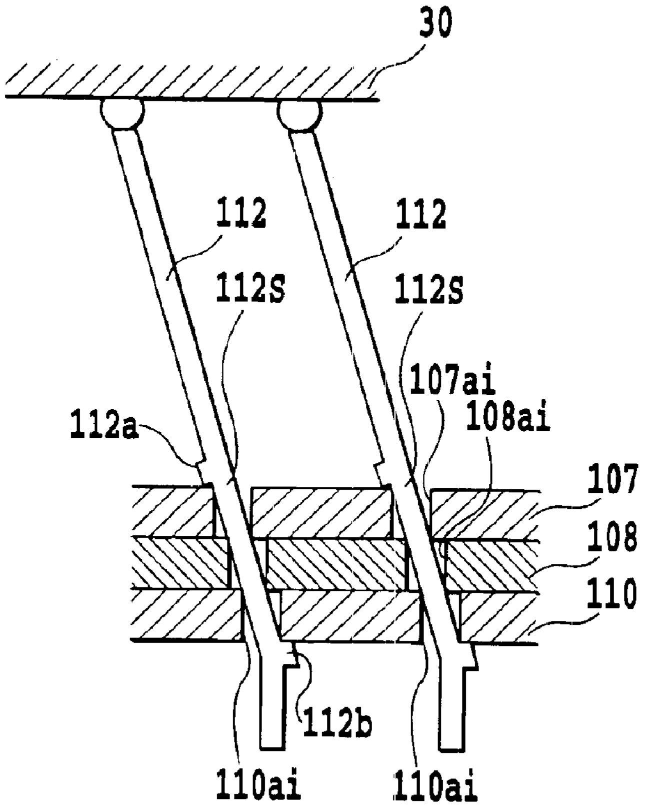
FIGS. 16A and 16B are partially sectional view for illustrating a process for assembling contact pins used in a furthermore embodiment of the inventive method for assembling a semiconductor device socket, respectively.
Figure 16B:
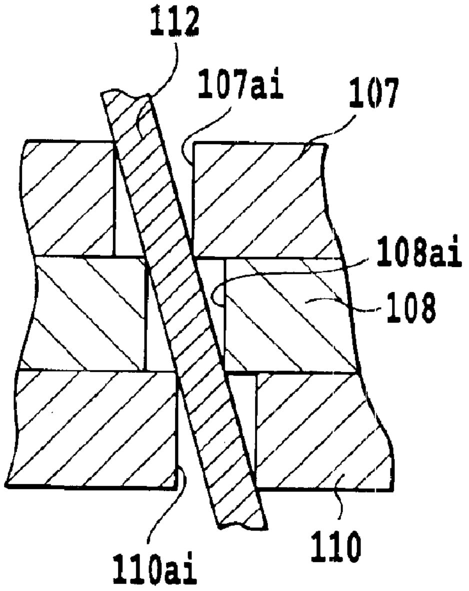

In an embodiment shown in FIGS. 16A and 16B, during the above-mentioned assembly process of the semiconductor device socket, contact pins 112 are arranged in a contact pin supporting plate 107 by using a first position-restricting plate 108 and a second position-restricting plate 110. In this regard, the assembly of the contact pin supporting plate 107, the first position-restricting plate 108 and the second position-restricting plate 110 is finally fixed in the supporting plate accommodating portion of the socket body by screws threaded into female-threaded holes of the socket body through holes of the supporting plate and the position-restricting plate.

In the embodiment shown in FIG. 16A, the method for assembling a semiconductor device socket in accordance with the present invention is applied to a semiconductor device socket having contact pins 112 different in structure from those in the embodiments illustrated in FIGS. 1A, 13, 14 and 15.

The contact pin 112 has a stationary terminal section 112S supported, for example, in a slanting state relative to the contact pin supporting plate 107.

A contact force between the electrode of the semiconductor device 30 and the contact portion of the contact pin 112 is set within the proper range by the contact pin 112 supported in a slanting state. The stationary terminal section 112S is provided with a pair of engaging portions 112*a* and 112*b* engaged with the outer edge of hole 107*ai* of the contact pin supporting plate 107 and the outer edge of a hole

110*ai* of the second position-restricting plate 110, respectively as described later. Each projection height of the engaging portions 112*a* and 112*b* are set such that the engaging portions 112*a* and 112*b* are able to pass through the hole 107*ai* 108*ai* and 110*ai.*

Upon attaching the contact pins 112 to the contact pin supporting plate 107, first, the first position-restricting plate 108 and the contact pin supporting plate 107 are sequentially overlaid and positioned on the second position-restricting plate 110. Thereafter, a tip end of the stationary terminal section 112S of the contact pin 112 is inserted into a common gap formed by a hole 108*ai* (i=1 to n; n is a positive integer) of the first position-restricting plate 108 and a hole 110*ai* (i=1 to n; n is a positive integer) of the second position-restricting plate 110 through a hole 107*ai* (i=1 to n; n is a positive integer) of the contact pin supporting plate 107.

Then, as shown in FIG. 16A, after the first position-restricting plate 108 and the second position-restricting plate 110 have been slid in the same direction relative to the contact pin supporting plate 107, the positioning pins (not shown) are press-fit into common holes to integrate the first position-restricting plate 108, the second position-restricting plate 110 and the contact pin supporting plate 107 with each other. In this regard, the shifting amount of the first position-restricting plate 108 is smaller than that of the second position-restricting plate 110.

Accordingly, since an intermediate portion between the engaging portions 112*a* and 112*b* of the stationary terminal section 112S of the respective contact pin 112 is brought into contact with an open end of the hole 107*ai* of the contact pin supporting plate 107, an open end of the hole 108*ai* of the first position-restricting plate 108 and an open end of the hole 110*ai* of the second position-restricting plate 110, the rotation of the contact pin 112 on its own axis and the axial movement thereof are inhibited by the frictional force and the engaging portions 112*a* and 112*b*.

Subsequently, the assembly of the positioning pins, the contact pin supporting plate 107 having each contact pins 112 arranged, the first position-restricting plate 108 and the second position-restricting plate 110 is fixed in the supporting plate accommodating portion of the socket body by screws.

The assembly process carried out thereafter is the same as in the above-mentioned embodiment.

In the above-described embodiments, while an example of the inventive method is applied to a so-called open-top type semiconductor device socket, the present invention should not be limited thereto but may be applied other types, such as a clamshell type semiconductor device socket.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A method for assembling a semiconductor device socket comprising the steps of:

overlaying a supporting plate for fixing stationary terminal portions of contact terminals for electrically connecting electrode sections of a semiconductor device to an electro-conductive layer of a wiring board on a first position-restricting plate and a second position-restricting plate with each other while coinciding attachment holes of said supporting plate with holes of said first position-restricting plate and said second position-restricting plate, inserting a tip end of the stationary terminal section of the contact terminal into a common gap in the attachment holes of said supporting plate and the holes of said first position-restricting plate and said second position-restricting plate overlaid with each other and supporting the end of the stationary terminal section of the contact terminal by the peripheral edges of the holes, and engaging a portion being engaged of the stationary terminal section with the attachment hole of said supporting plate while maintaining the grip of the end of the stationary terminal section of the contact terminal.

2. A method for assembling a semiconductor device socket as defined in claim 1, further comprising a step for separating said first position-restricting plate and said second position-restricting plate from said supporting plate.

3. A method for assembling a semiconductor device socket as defined in claim 1, wherein the holes of said first position-restricting plate and the holes of said second position-restricting plate are slid away from each other in a common plane to support the end of the stationary terminal section of the contact terminal by the peripheral edges of the holes.

4. A method for assembling a semiconductor device socket as defined in claim 1, wherein the stationary terminal section of the contact terminal has an engaging portion to be engageable with an open end peripheral edge of the hole in said first position-restricting plate.

5. A method for assembling a semiconductor device socket as defined in claim 1, wherein the portion being engaged of the stationary terminal section in the contact terminal has a nib to be press-fit into the attachment hole of said supporting plate.

6. A method for assembling a semiconductor device socket as defined in claim 1, further comprising a step for fixing said supporting plate, said first position-restricting plate and said second position-restricting plate onto the circumference of a contact terminal accommodating portion for accommodating the contact terminals.

7. A method for assembling a semiconductor device socket as defined in claim 1, wherein the stationary terminal section of the contact terminal has an engaging portions engageable with open end peripheral edges of the attachment hole in said supporting plate and the hole of said second position-restricting plate.

8. A method for assembling a semiconductor device socket as defined in claim 1, wherein an outer tube of the contact terminal is held by a frictional force operated between the inner circumference forming the attachment hole of said supporting plate and the inner circumference forming the hole of said first position-restricting plate and said second position-restricting plate.

* * * * *

UNITED STATES PATENT AND TRADEMARK OFFICE

CERTIFICATE OF CORRECTION

PATENT NO. : 6,896,546 B2

DATED : May 24, 2005

INVENTOR(S) : Kenji Ichihara et al.

It is certified that error appears in the above-identified patent and that said Letters Patent is hereby corrected as shown below:

Title page,
Item [57], ABSTRACT,
Line 3, "there the" should read -- there; the --.

Column 16,
Line 50, "portions" should read -- portion --.

Signed and Sealed this

Eighth Day of November, 2005

JON W. DUDAS
*Director of the United States Patent and Trademark Office*